US007396022B1

(12) United States Patent  
Moghadam et al.

(10) Patent No.: US 7,396,022 B1
(45) Date of Patent: Jul. 8, 2008

(54) SYSTEM AND METHOD FOR OPTIMIZING WAFER FLATNESS AT HIGH ROTATIONAL SPEEDS

(75) Inventors: Alireza Shahdoost Moghadam, San Jose, CA (US); Vamsi Mohan Velidandla, Hayward, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 253 days.

(21) Appl. No.: 10/952,590

(22) Filed: Sep. 28, 2004

(51) Int. Cl.
 B23B 31/30 (2006.01)
(52) U.S. Cl. .............................. 279/3; 269/21; 118/500; 451/388
(58) Field of Classification Search ................. 279/3; 269/21; 118/500, 730; 451/289, 388
See application file for complete search history.

(56) References Cited

U.S. PATENT DOCUMENTS

| 2,955,829 A | * | 10/1960 | Brewster .................... 279/3 |
| 3,004,766 A | * | 10/1961 | Bryant ........................ 279/3 |
| 3,730,134 A | * | 5/1973 | Kadi .......................... 118/663 |
| 3,885,875 A | | 5/1975 | Rosenfeld et al. |
| 3,955,163 A | * | 5/1976 | Novak ........................ 355/132 |
| 4,182,259 A | | 1/1980 | Garner et al. |
| 4,184,292 A | * | 1/1980 | DeFazio et al. ............. 451/388 |
| 4,332,477 A | | 6/1982 | Sato |
| 4,538,909 A | | 9/1985 | Bible et al. |
| 4,585,348 A | | 4/1986 | Chastang et al. |
| 4,668,860 A | | 5/1987 | Anthon |
| 4,870,631 A | | 9/1989 | Stoddard |
| 4,873,430 A | | 10/1989 | Juliana et al. |
| 5,017,012 A | | 5/1991 | Merritt, Jr. et al. |

(Continued)

FOREIGN PATENT DOCUMENTS

JP  5818532 A  * 10/1983

(Continued)

OTHER PUBLICATIONS

W.C. Leung, W. Crooks, H. Rosen and T. Strand, *An Optical Method Using a Laser and an Integrating Sphere Combination for Characterizing the Thickness Profile of Magnetic Media*, Sep. 1989, IEEE Transaction on Magnetics, vol. 25, No. 5. pp. 3659-3661.

(Continued)

*Primary Examiner*—Monica S. Carter
*Assistant Examiner*—Michael W Talbot
(74) *Attorney, Agent, or Firm*—Caven & Aghevli LLC

(57) ABSTRACT

The present invention is a chuck having a vacuum groove that is capable of holding a wafer as the chuck rotates on a spindle. As the chuck rotates the air pressure above the center of the wafer is reduced. In order to reduce the bowing of the wafer that can result from this low pressure area above the wafer, the present invention introduces venturi holes in the chuck which reduces the air pressure in the area below the wafer. In order to prevent the air pressure in the area below the wafer from decreasing too far, the present invention uses air inlet holes to balance the affect of the venturi holes in order to substantially balance the air pressure above and below the wafer which results in significantly less bowing of the wafer when compared to conventional systems. The present invention accomplishes this without requiring sensors or other active measuring devices to help reduce the bowing of the wafer.

24 Claims, 4 Drawing Sheets

U.S. PATENT DOCUMENTS

| | | | |
|---|---|---|---|
| 5,129,724 A | 7/1992 | Brophy et al. | |
| 5,171,398 A * | 12/1992 | Miyamoto | 156/552 |
| 5,189,481 A | 2/1993 | Jann et al. | |
| 5,196,906 A | 3/1993 | Stover et al. | |
| 5,230,741 A * | 7/1993 | van de Ven et al. | 118/728 |
| 5,270,794 A | 12/1993 | Tsuji et al. | |
| 5,293,216 A | 3/1994 | Moslehi | |
| 5,313,542 A | 5/1994 | Castonguay | |
| 5,331,406 A | 7/1994 | Fishbaine et al. | |
| 5,374,829 A * | 12/1994 | Sakamoto et al. | 250/453.11 |
| 5,406,082 A | 4/1995 | Pearson et al. | |
| 5,416,594 A | 5/1995 | Gross et al. | |
| 5,421,595 A * | 6/1995 | Cripe et al. | 279/3 |
| 5,446,549 A | 8/1995 | Mazumder et al. | |
| 5,463,897 A | 11/1995 | Prater et al. | |
| 5,586,101 A | 12/1996 | Gage et al. | |
| 5,608,527 A | 3/1997 | Valliant et al. | |
| 5,610,897 A | 3/1997 | Yamamoto et al. | |
| 5,620,525 A * | 4/1997 | van de Ven et al. | 118/728 |
| 5,631,171 A | 5/1997 | Sandstrom et al. | |
| 5,633,747 A | 5/1997 | Nikoonahad | |
| 5,644,562 A | 7/1997 | de Groot | |
| 5,694,214 A | 12/1997 | Watanabe et al. | |
| 5,715,058 A | 2/1998 | Bohnert et al. | |
| 5,726,455 A | 3/1998 | Vurens | |
| 5,748,305 A | 5/1998 | Shimono et al. | |
| 5,754,297 A | 5/1998 | Nulman | |
| 5,777,740 A | 7/1998 | Lacey et al. | |
| 5,798,829 A | 8/1998 | Vaez-Iravani | |
| 5,835,220 A | 11/1998 | Kazama et al. | |
| 5,864,394 A | 1/1999 | Jordan, III et al. | |
| 5,875,029 A | 2/1999 | Jann et al. | |
| 5,880,838 A | 3/1999 | Marx et al. | |
| 5,882,417 A * | 3/1999 | van de Ven et al. | 118/728 |
| 5,903,342 A | 5/1999 | Yatsugake et al. | |
| 5,909,276 A | 6/1999 | Kinney et al. | |
| 5,951,891 A | 9/1999 | Barenboim et al. | |
| 5,978,091 A | 11/1999 | Jann et al. | |
| 5,985,680 A | 11/1999 | Singhal et al. | |
| 5,986,761 A | 11/1999 | Crawforth et al. | |
| 5,986,763 A | 11/1999 | Inoue | |
| 5,989,760 A * | 11/1999 | Mangat et al. | 430/22 |
| 5,995,226 A | 11/1999 | Abe et al. | |
| 6,028,671 A | 2/2000 | Svetkoff et al. | |
| 6,034,378 A | 3/2000 | Shiraishi | |
| 6,043,502 A | 3/2000 | Ahn | |
| 6,069,095 A * | 5/2000 | Haider | 438/795 |
| 6,081,325 A | 6/2000 | Leslie et al. | |
| 6,088,092 A | 7/2000 | Chen et al. | |
| 6,091,493 A | 7/2000 | Stover et al. | |
| 6,107,637 A | 8/2000 | Watanabe et al. | |
| 6,118,525 A | 9/2000 | Fossey et al. | |
| 6,134,011 A | 10/2000 | Klein et al. | |
| 6,157,444 A | 12/2000 | Tomita et al. | |
| 6,169,601 B1 | 1/2001 | Eremin et al. | |
| 6,172,752 B1 | 1/2001 | Haruna et al. | |
| 6,201,601 B1 | 3/2001 | Vaez-Iravani et al. | |
| 6,248,988 B1 | 6/2001 | Krantz | |
| 6,271,676 B1 * | 8/2001 | Montoya | 324/765 |
| 6,271,916 B1 | 8/2001 | Marxer et al. | |
| 6,290,274 B1 * | 9/2001 | Montoya | 294/64.1 |
| 6,307,627 B1 | 10/2001 | Vurens | |
| 6,353,222 B1 | 3/2002 | Dotan | |
| 6,383,890 B2 * | 5/2002 | Takisawa et al. | 438/455 |
| 6,384,910 B2 | 5/2002 | Vaez-Iravani et al. | |
| 6,454,865 B1 * | 9/2002 | Goodman et al. | 118/728 |
| 6,509,966 B2 | 1/2003 | Ishiguro et al. | |
| 6,515,745 B2 | 2/2003 | Vurens et al. | |
| 6,542,248 B1 | 4/2003 | Schwarz | |
| 6,548,821 B1 | 4/2003 | Treves et al. | |
| 6,603,542 B1 | 8/2003 | Chase et al. | |
| 6,630,996 B2 | 10/2003 | Rao et al. | |
| 6,639,662 B2 | 10/2003 | Vaez-Iravani et al. | |
| 6,672,318 B1 * | 1/2004 | Tsuchiya et al. | 134/147 |
| 6,757,056 B1 | 6/2004 | Meeks et al. | |
| 6,804,003 B1 | 10/2004 | Wang et al. | |
| 6,805,338 B1 * | 10/2004 | Okuda | 269/21 |
| 6,809,809 B2 | 10/2004 | Kinney et al. | |
| 6,893,507 B2 * | 5/2005 | Goodman et al. | 118/725 |
| 2001/0000679 A1 | 5/2001 | Vaez-Iravani et al. | |
| 2001/0030296 A1 | 10/2001 | Ishimaru et al. | |
| 2002/0005945 A1 | 1/2002 | Isozaki et al. | |
| 2003/0025905 A1 | 2/2003 | Meeks | |
| 2003/0141673 A1 * | 7/2003 | Olgado et al. | 279/3 |
| 2004/0169850 A1 | 9/2004 | Meeks | |
| 2004/0206304 A1 * | 10/2004 | Menear | 118/500 |
| 2005/0035514 A1 * | 2/2005 | Hillman et al. | 269/21 |

FOREIGN PATENT DOCUMENTS

| | | |
|---|---|---|
| JP | 3-221804 | 9/1991 |
| JP | 04030417 A * | 2/1992 |
| JP | 04-162215 | 5/1992 |
| JP | 10-227764 | 8/1998 |
| JP | 11-173994 | 7/1999 |
| WO | WO 98/52019 | 11/1998 |

OTHER PUBLICATIONS

Steven W. Meeks, Walter E. Weresin, and Hal J. Rosen, *Optical Surface Analysis of the Head-Disk-Interface of Thin Film Disks*, Jan. 1995, Transactions of the ASME, Journal of Tribology, vol. 117, pp. 112-118.

Steven Meeks, Maxtor and Rusmin Kudinar, *The Next Battleground: Head-Disk Interface*, Mar. 1998, Data Storage, Test & Measurement, pp. 29-30, 34 and 38.

*Laser Scanning Surface Profilometer*, [online], Aug. 1970, [retrieved Jan. 29, 2001], pp. 789-790, Retrieved from the Internet: <URL: http://www.delphion.com/tdbs/tdb?&order=7OC101758.

Meeks, Steven W.: "A Combined Ellipsometer, Reflectometer, Scatterometer and Kerr Effect Microscope for Thin Film Disk Characterization," Machine Vision Applications in Industrial Inspection VIII, Proceedings of SPIE, vol. 3966, 2000, pp. 385-391, XP001085220.

Ikeda, Y. et al., "Characterization of a Disk Texture Transition Zone by Use of an Optical Surface Analyzer," Digest of Intermag., International Magnetics Conference, San Antonio, Apr. 18-21, 1995, p. Ed-2.

European Search Report, Application No. 04028745.0-2204, Apr. 6, 2005.

Meeks, Steven W., "Optical Surface Analyzer Inspects Transparent Wafers," Laser Focus World, Jul. 2003, pp. 105-106, 108.

* cited by examiner

SYSTEM AND METHOD FOR OPTIMIZING WAFER FLATNESS AT HIGH ROTATIONAL SPEEDS

FIELD OF THE INVENTION

The present invention relates to the field of optical profilometers and more particularly to the field of wafer inspection machines.

BACKGROUND OF THE INVENTION

Wafer inspection machines typically permit a wafer to be placed on top of a rotating chuck with rotation speeds that exceed 4000 revolutions per minute being common. In some conventional systems the wafer lies flat upon a receiving surface in the wafer inspection machine which contacts substantially the entire wafer on one side. When the wafer spins the wafer remains flat. One problem with this system is that by contacting substantially the entire wafer on one side there is an increased likelihood of contaminants being introduced to the wafer on the contacting side. In addition, any contaminant caught between the two contacting surfaces will cause a deformation of the wafer surface, jeopardizing the accuracy of the defect inspection, especially for optical inspection systems.

In another conventional system, a chuck includes a vacuum corridor whose ends receive the wafer. The wafer contacts the chuck near the wafer's outer edge. The wafer is held in place at high rotational speeds (in excess of 3000 rpm) by supplying vacuum to this corridor. A problem with this system is that at high rotation speeds the air pressure above the wafer is less than the air pressure below the wafer which results in the wafer bowing upwards. Such bowing can prevent the wafer inspection machine from properly inspecting the wafer because, for example, the bowing may result in the wafer being out of focus in some areas which may prevent defects from being detected in these areas.

One conventional solution involves using a sensor on the chuck to actively measure the distance the chuck to the center of the wafer as the chuck rotates. Using this information a pressure regulator modifies the pressure beneath the wafer to reduce the bowing of the wafer. The problem with this solution is that it adds cost and complexity to the system.

What is needed is a system and method for modifying the vacuum chuck to automatically reduce the bow of an object placed thereupon without requiring any feedback mechanism.

SUMMARY OF THE INVENTION

The present invention is a chuck having a vacuum groove that is capable of holding a wafer as the chuck rotates on a spindle. As the chuck rotates the air pressure above the center of the wafer is reduced. In order to reduce the bowing of the wafer that can result from this low pressure area above the wafer, the present invention introduces venturi holes in the chuck which reduces the air pressure in the area below the wafer. In order to prevent the air pressure in the area below the wafer from decreasing too much, the present invention uses air inlet holes to balance the affect of the venturi holes in order to substantially balance the air pressure above and below the wafer which results in significantly less bowing of the wafer when compared to conventional systems. The present invention accomplishes this without requiring sensors or other active measuring devices for reducing the bowing of the wafer.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE INVENTION

A preferred embodiment of the present invention is now described with reference to the figures where like reference numbers indicate identical or functionally similar elements. Also in the figures, the left most digit of each reference number corresponds to the figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

Figure 1:
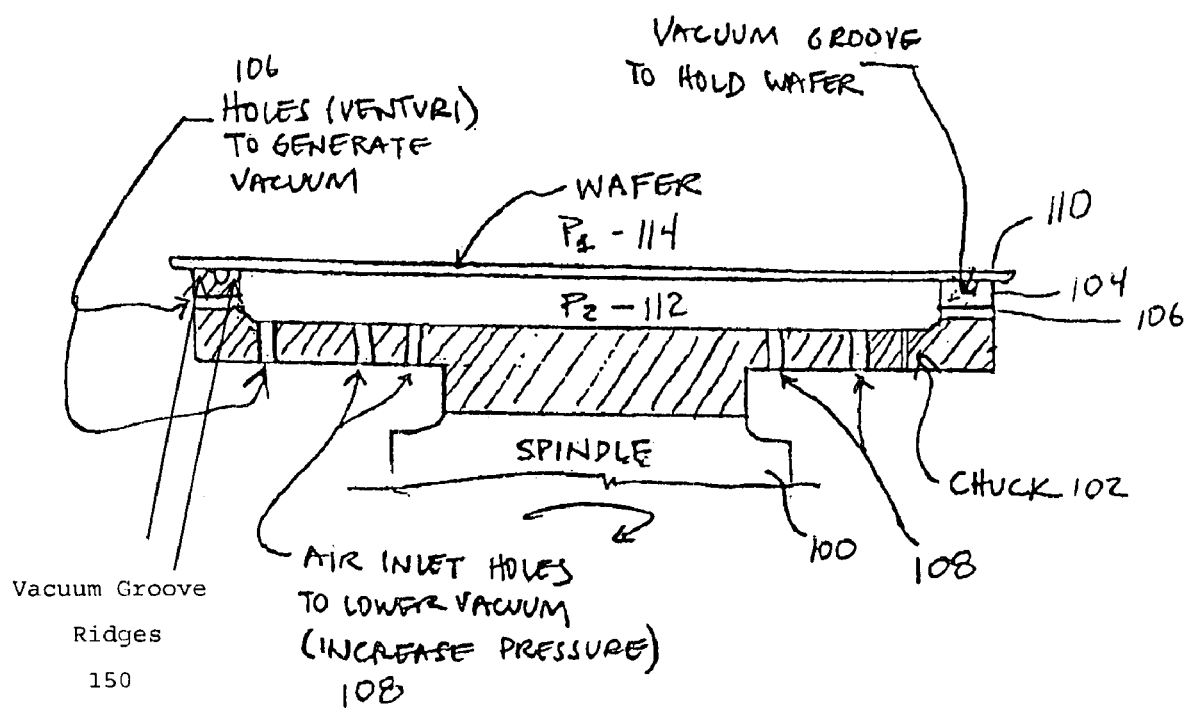
FIG. 1 is a cross-sectional view of a chuck with a vacuum groove according to one embodiment of the present invention with the chuck holding a wafer.
Figure 2:
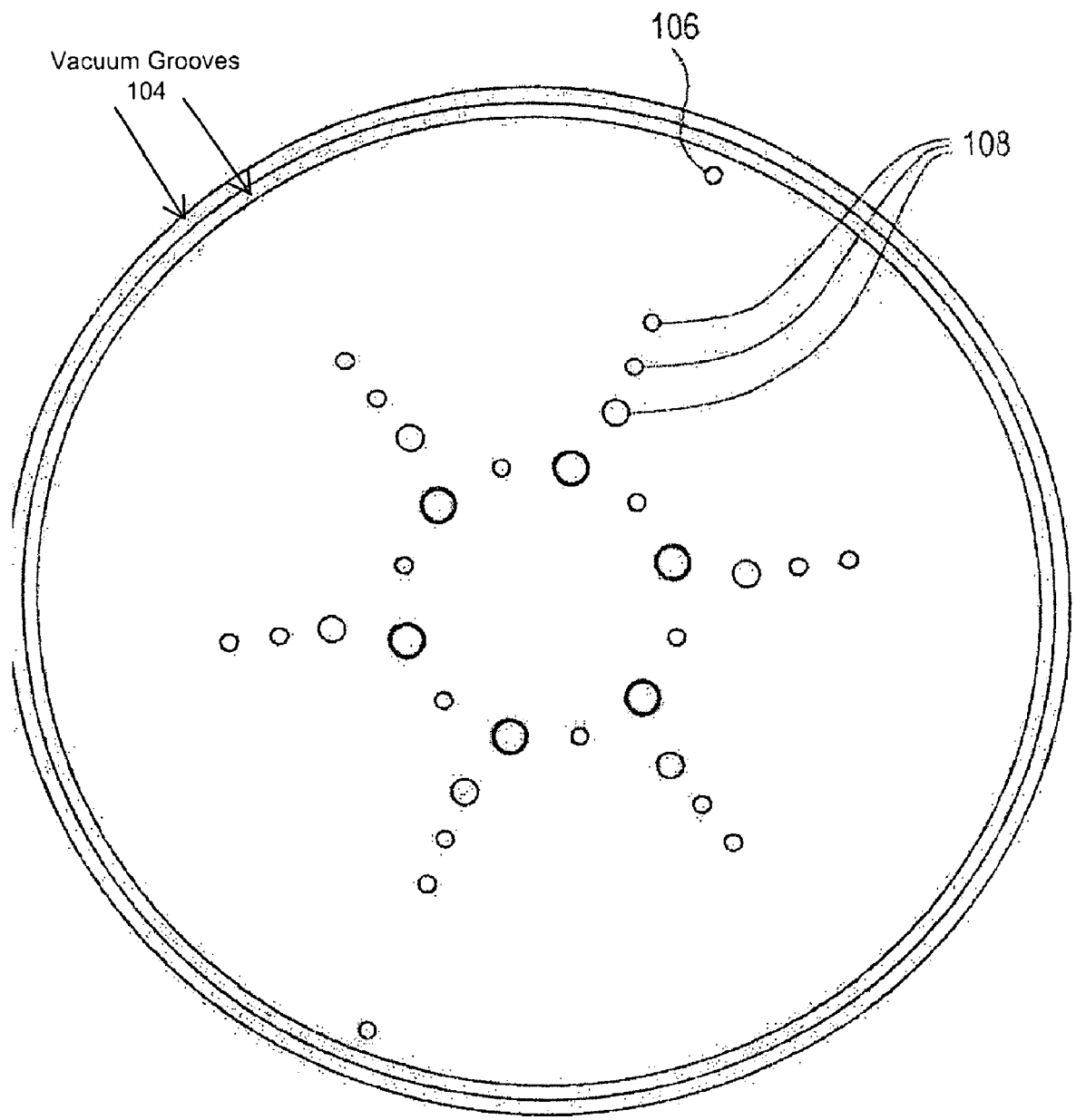
FIG. 2 is an illustration is a top view of a chuck with a vacuum groove according to one embodiment of the present invention.

FIG. 1 is a cross-sectional view of a chuck 102 having a vacuum groove 104 according to one embodiment of the present invention with the chuck shown securing a wafer 110. A spindle 100 rotates and is coupled to the chuck 102 that includes a vacuum groove 104 that receives a wafer 110. The wafer can be thin film disk, a semiconductor wafer, a compound semiconductor wafer, a glass wafer or a plastic disk for example. FIG. 2 is an illustration is a top view of a chuck 102 with a vacuum groove 104 according to one embodiment of the present invention. In FIG. 2, the wafer is not shown. In this perspective the vacuum groove is shown to be circular and has a radius that is smaller than the radius of the wafer 110 it receives. In one embodiment, the radius of the vacuum groove is approximately 85 millimeters (mm). In one embodiment the width of the vacuum groove is 0.9 mm and the vacuum groove includes two ridges (150) of the vacuum groove (the inner ridge and the outer ridge) that provide enough contact area with the wafer 110 to prevent it from shearing off the chuck when the chuck and wafer are rotating at high rates. In alternate embodiments the shape and radius can differ and, in some embodiments, the vacuum groove can be discontinuous.

Figure 3A:
FIG. 3a is an illustration depicting the bowing of a wafer at a high revolution rate when the air pressure above the center of the wafer is less than the air pressure below the center of the wafer.

The air pressure in the vacuum groove is reduced in order to hold the wafer 110 on the chuck 102 while the chuck 102 is rotating. As described above, a problem with conventional systems is that, as the wafer rotates, the air pressure above $P_1$ the wafer is reduced which causes the wafer to bow. FIG. 3a is an illustration depicting the bowing of a wafer at a high rate of revolution when the pressure above $P_1$ the center of the wafer is less than the pressure below $P_2$ the center of the wafer.

Figure 3B:
FIG. 3b is an illustration depicting the lack of bowing of a wafer when the air pressure above the center of the wafer is approximately equal to the air pressure below the center of the wafer.

In contrast, FIG. 3b is an illustration depicting the lack of bowing of a wafer when the air pressure above $P_1$ the center of the wafer is approximately equal to the air pressure below $P_2$ the center of the wafer.

The present invention reduces bowing of the wafer by reducing the pressure below $P_2$ the wafer so that is more aligned with the pressure above $P_1$ the wafer. In conventional systems, the center of a wafer may bow well in excess of 30 micrometers (μm). Such a large bow may cause the device reading the wafer to not work properly. For example, devices for inspecting a wafer, such as the C2, which is commercially available from Candela Instruments, Inc. in Fremont, Calif., images a wafer by scanning a laser across the rotating surface of the wafer. The depth of focus of the inspection optics in the C2 is approximately 30 μm. Therefore, bowing that exceeds this focus depth may cause a problem during wafer inspection since parts of the wafer will be out of focus and defects or other characteristics of the wafer in the bowed areas may not be properly detected unless the optics are refocused.

The present invention uses the principle that if the air pressure on both sides of the wafer is equalized during a scan, then the wafer will not deflect or bow. In the present invention, the rotation of the chuck can be harnessed to create lower pressure beneath $P_2$ the wafer by introducing venturi holes 106 on the side wall and the floor plate of the chuck. These holes act as small venturis that suck air out of the area 112 below the wafer. However, even the smallest of venturi holes 106 will cause a large air flow rate out of the area 112 below the wafer which reduces the air pressure and may cause the air pressure in the area 112 below the wafer to become substantially lower than the air pressure in the area 114 above the wafer which causes the wafer to bow downward. In addition, such bowing may cause the wafer 110 to lose its seal with the vacuum groove 104 which may result in the wafer 110 detaching itself from the chuck 102.

In order to compensate for this 'negative' deflection, the present invention introduces inlet holes 108 that, in one embodiment, are positioned closer toward the center of the chuck as compared to the venturi holes 106. The high linear velocity at the outer edge of the chuck enables the outer holes [106] to act as venture holes, sucking air out of the chamber. In order to compensate for the air flowing out, larger holes have to be made closer to the center of the chuck, enabling air to flow into the chamber. The number of inlet holes 108 and venturi holes 106 can vary depending upon a variety of factors including the type of wafer, the thickness of the wafer and the anticipated rotation rate. In one embodiment, numerous inlet holes 108 and venturi holes 106 are available to be used and the user can cover or block those that are not necessary for the particular wafer 110 that will be tested. The inlet holes 108 reduce the effect of the venturi holes 106 and result in a substantial reduction in the bowing or deflection of the wafer at high rates of rotation.

FIG. 2 illustrates a configuration of the inlet holes 108 and venturi holes 106 on a chuck designed to receive 8 inch (or 200 mm) diameter wafers.

Figure 4:
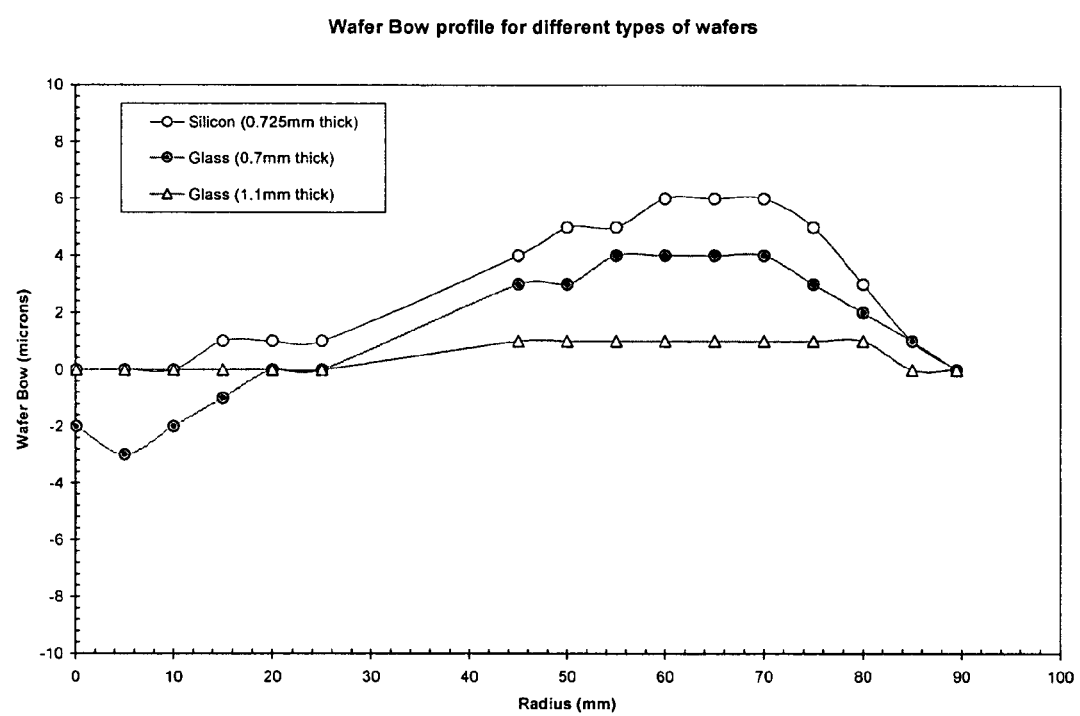
FIG. 4 is an table illustrating experimental results for one embodiment of the present invention.

FIG. 4 is a table illustrating experimental results for one embodiment of the present invention using the configuration illustrated in FIG. 2. In this experiment three different wafers were used including a 1.1 mm thick glass wafer, a 0.7 mm thick glass wafer and a 0.725 mm thick silicon wafer. The present invention maintained the bowing to well under 10 μm for each of these various types of wafers at a rotational speed of 5000 revolutions per minute (rpm). This reduction in bowing occurs because the air pressure in the area below the wafer 112 substantially matches the air pressure in the area 114 above the wafer. The horizontal axis represents the distance from the center of the wafer in millimeters while the vertical axis represents the bowing of the wafer in microns. The nature of the air flow through the holes in the chuck results in the wafer bowing up closer to the point of contact with the chuck.

The present invention does not require the use of sensors or gas delivery systems or other real-time feedback to adjust the pressure in the area 112 below the wafer. Instead the present invention uses the combination of pre-set venturi holes 106 and air inlet holes 108 to significantly reduce the bowing (deflection) of the wafer during high rotational speeds when compared to conventional systems.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A chuck capable of receiving a wafer and capable of rotating, a first region being formed by an area between the chuck and the wafer, a second region being adjacent to the wafer on a side of the wafer opposite the first region, the chuck comprising:

a vacuum groove, capable of providing a low pressure suction force at a first end, said first end capable of securing the wafer;

at least one venturi hole for lowering an air pressure in the first region in response to a rotation of said chuck;

at least one air inlet hole for increasing the air pressure in the first region when said chuck rotates;

a plurality of inlet holes, wherein a size of the inlet holes that are closer to a center of the chuck are larger than a size of the inlet holes that are farther from the center of the chuck, wherein said pressure in said first region is reduced using said at least one venturi hole and said at least one air inlet hole to substantially match a pressure of the second region, wherein the at least one air inlet hole has a larger opening than the at least one venturi hole.

2. The chuck of claim 1 wherein a displacement of said wafer due to differences in pressure in said first and second regions is less than 30 micrometers.

3. The chuck of claim 1 wherein a displacement of said wafer due to differences in pressure in said first and second regions is less than 10 micrometers.

4. The chuck of claim 1 wherein a displacement of said wafer due to differences in pressure in said first and second regions is less than 5 micrometers.

5. The chuck of claim 1, wherein said first end of said vacuum groove includes a vacuum opening formed between two ridges of said vacuum groove.

6. The chuck of claim 5, wherein said vacuum opening is a continuous shape.

7. The chuck of claim 5, wherein the shape of said vacuum opening is substantially circular.

8. The chuck of claim 5, further comprising a second vacuum groove capable of providing a low pressure suction force, said second vacuum groove capable of receiving the wafer.

9. The chuck of claim 1, having at least two venturi holes wherein, prior to rotating the chuck, at least one of said venturi holes is blocked.

10. The chuck of claim 1, having at least two air intake holes, wherein, prior to rotating the chuck, at least one of said air intake holes is blocked.

11. The chuck of claim 1 wherein the venturi hole is coupled to a side wall of the chuck.

12. The chuck of claim 1 wherein the venturi hole is coupled to a floor plate of the chuck.

13. A system capable of receiving a wafer and capable of rotating, a first region being formed by an area between a chuck and the wafer, a second region being adjacent to the wafer on a side of the wafer opposite the first region, the chuck comprising:

vacuum groove means for providing a low pressure suction force at a first end, said first end capable of securing the wafer;

venturi hole means within said chuck for lowering an air pressure in the first region in response to a rotation of said chuck;

air inlet hole means within said chuck for increasing the air pressure in the first region when said chuck rotates;

a plurality of inlet hole means, wherein a size of at least some of the plurality of inlet hole means that are closer to a center of the chuck are larger than a size of other ones of the plurality of inlet hole means that are farther from the center of the chuck, wherein said pressure in said first region is reduced using said venturi hole means and said air inlet hole means to substantially match a pressure of the said second region, wherein the air inlet hole means has a larger opening than the venturi hole means.

14. The system of claim 13 wherein a displacement of said wafer due to differences in pressure in said first and second regions is less than 30 micrometers.

15. The system of claim 13 wherein a displacement of said wafer due to differences in pressure in said first and second regions is less than 10 micrometers.

16. The system of claim 13 wherein a displacement of said wafer due to differences in pressure in said first and second regions is less than 5 micrometers.

17. The system of claim 13, wherein said first end of said vacuum groove means includes a vacuum opening formed between two ridges of said vacuum groove.

18. The system of claim 17, wherein said vacuum opening forms a continuous shape.

19. The system of claim 17, wherein the shape of said vacuum opening is substantially circular.

20. The system of claim 17, further comprising a second vacuum groove means capable of providing a low pressure suction force, said second vacuum groove capable of receiving the wafer.

21. The system of claim 13, wherein said venturi hole means includes at least two venturi holes wherein, prior to rotating the chuck, at least one of said venturi holes is blocked.

22. The system of claim 13, wherein said air intake means includes at least two air intake holes, wherein, prior to rotating the chuck, at least one of said air intake holes is blocked.

23. The system of claim 13 wherein the venturi hole means is coupled to a side wall of the chuck.

24. The system of claim 13 wherein the venturi hole means is coupled to a floor plate of the chuck.

* * * * *